United States Patent
Ciocchini et al.

(10) Patent No.: US 12,205,641 B2
(45) Date of Patent: *Jan. 21, 2025

(54) DYNAMICALLY BOOSTING READ VOLTAGE FOR A MEMORY DEVICE

(71) Applicant: Micron Technology, Inc., Boise, ID (US)

(72) Inventors: Nicola Ciocchini, Boise, ID (US); Andrea Gotti, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/834,702

(22) Filed: Jun. 7, 2022

(65) Prior Publication Data

US 2022/0301623 A1     Sep. 22, 2022

Related U.S. Application Data

(63) Continuation of application No. 17/101,846, filed on Nov. 23, 2020, now Pat. No. 11,373,705.

(51) Int. Cl.
  *G11C 13/00* (2006.01)
  *H10N 70/00* (2023.01)
(52) U.S. Cl.
  CPC .......... *G11C 13/004* (2013.01); *G11C 13/003* (2013.01); *G11C 13/0069* (2013.01);
  (Continued)
(58) Field of Classification Search
  CPC . G11C 13/004; G11C 13/003; G11C 13/0069; G11C 2013/0045;
  (Continued)

(56) References Cited

U.S. PATENT DOCUMENTS

| 4,589,003 A | 5/1986 | Yamada et al. |
| 4,811,267 A | 3/1989 | Ando et al. |

(Continued)

FOREIGN PATENT DOCUMENTS

| CN | 101345083 A | * | 1/2009 | ......... G11C 11/5678 |
| CN | 101620880 A | * | 1/2010 | ......... G06F 13/4239 |

(Continued)

OTHER PUBLICATIONS

Chow, Jeffery, Modeling and design of low-voltage ferroelectric memories, 2006, University of Toronto (Canada). All pages. (Year: 2006).*

(Continued)

*Primary Examiner* — Michael T Tran
(74) *Attorney, Agent, or Firm* — Greenberg Traurig (57) ABSTRACT

Systems, methods, and apparatus related to dynamically determining read voltages used in memory devices. In one approach, a memory device has a memory array including memory cells. One or more resistors are formed as part of the memory array. A memory controller increments a counter as write operations are performed on the memory cells. When the counter reaches a limit, a write operation is performed on the resistors. The write operation applies voltages to the resistors similarly as applied to the memory cells over time during normal operation. When performing a read operation, a current is applied to one or more of the resistors to determine a boost voltage. When reading the memory cells, a read voltage is adjusted based on the boost voltage. The memory cells are read using the adjusted read voltage.

18 Claims, 10 Drawing Sheets

(52) U.S. Cl.
CPC ......... *H10N 70/021* (2023.02); *H10N 70/063* (2023.02); *H10N 70/826* (2023.02); *H10N 70/882* (2023.02); *G11C 2013/0045* (2013.01)

(58) Field of Classification Search
CPC .............. H01L 45/1233; H01L 45/141; H01L 45/1608; H01L 45/1675
USPC .................................................. 365/148, 158
See application file for complete search history.

(56) References Cited

U.S. PATENT DOCUMENTS

| | | | |
|---|---|---|---|
| 5,694,366 A | 12/1997 | Chevallier et al. | |
| 6,044,036 A * | 3/2000 | Flannagan | G11C 7/1051 365/207 |
| 6,278,633 B1 | 8/2001 | Wong et al. | |
| 9,640,273 B1 | 5/2017 | Chen et al. | |
| 10,263,039 B2 * | 4/2019 | Pellizzer | H10N 70/8828 |
| 10,431,281 B1 | 10/2019 | Fackenthal et al. | |
| 10,497,866 B1 * | 12/2019 | Fuller | H10B 63/24 |
| 10,679,698 B2 * | 6/2020 | Damle | G06F 13/1668 |
| 10,770,139 B2 * | 9/2020 | Kim | G11C 13/0069 |
| 10,937,486 B1 * | 3/2021 | Someya | G11C 7/1084 |
| 11,373,705 B2 | 6/2022 | Ciocchini et al. | |
| 2002/0084986 A1 | 7/2002 | Armstrong | |
| 2004/0090839 A1 | 5/2004 | Wuidart | |
| 2005/0078530 A1 * | 4/2005 | Han | G11C 7/1078 365/189.05 |
| 2005/0237794 A1 * | 10/2005 | Hidaka | G11C 11/1675 365/162 |
| 2006/0163666 A1 * | 7/2006 | Shin | H01L 27/0629 257/E27.047 |
| 2006/0289942 A1 * | 12/2006 | Horii | H10N 70/20 438/210 |
| 2007/0120107 A1 | 5/2007 | Hayakawa | |
| 2007/0159895 A1 * | 7/2007 | Sumitani | G11C 16/3454 365/189.05 |
| 2008/0080228 A1 * | 4/2008 | Nirschl | G11C 11/56 365/148 |
| 2008/0151590 A1 | 6/2008 | Rogers et al. | |
| 2009/0154255 A1 * | 6/2009 | Amirabadi | G11C 7/1078 330/253 |
| 2009/0268509 A1 * | 10/2009 | Maejima | G11C 5/02 365/189.09 |
| 2010/0103726 A1 * | 4/2010 | Bae | G11C 11/5678 365/210.1 |
| 2010/0128519 A1 | 5/2010 | Li et al. | |
| 2010/0165711 A1 * | 7/2010 | Lee | G11C 13/0004 365/163 |
| 2010/0214831 A1 * | 8/2010 | Kim | G11C 11/5678 365/189.04 |
| 2010/0315870 A1 * | 12/2010 | Abedifard | G11C 11/1677 365/171 |
| 2012/0039140 A1 * | 2/2012 | Kim | G11C 17/16 365/225.7 |
| 2012/0320656 A1 | 12/2012 | Chung | |
| 2012/0320657 A1 | 12/2012 | Chung | |
| 2013/0119341 A1 * | 5/2013 | Liu | H10B 63/20 257/4 |
| 2013/0224928 A1 * | 8/2013 | Pramanik | H10N 70/24 257/E21.004 |
| 2014/0063925 A1 * | 3/2014 | Friedman | G11C 13/0069 365/163 |
| 2014/0252300 A1 * | 9/2014 | Somaschini | H10N 70/826 257/4 |
| 2015/0243352 A1 * | 8/2015 | Park | G11C 13/0004 365/163 |
| 2015/0357565 A1 * | 12/2015 | Pellizzer | H10B 63/24 257/4 |
| 2018/0130517 A1 * | 5/2018 | Ok | G11C 11/4093 |
| 2018/0366197 A1 * | 12/2018 | Wang | G11C 13/0097 |
| 2018/0374900 A1 * | 12/2018 | Pellizzer | H01L 28/20 |
| 2019/0043571 A1 * | 2/2019 | Damle | G11C 13/0035 |
| 2019/0097002 A1 | 3/2019 | Nakanishi | |
| 2019/0252019 A1 * | 8/2019 | Aoki | G11C 13/003 |
| 2019/0286372 A1 * | 9/2019 | Yang | G06F 11/1068 |
| 2020/0020396 A1 | 1/2020 | Kanamori et al. | |
| 2020/0021303 A1 * | 1/2020 | Seo | H03F 3/45632 |
| 2020/0098427 A1 * | 3/2020 | Lee | G11C 13/003 |
| 2020/0135272 A1 * | 4/2020 | Wu | G11C 13/0026 |
| 2020/0151052 A1 * | 5/2020 | Qawami | G06F 3/0688 |
| 2020/0388332 A1 * | 12/2020 | Grobis | G11C 13/0033 |
| 2021/0027813 A1 | 1/2021 | Boniardi et al. | |
| 2021/0098064 A1 * | 4/2021 | Lee | G11C 13/0038 |
| 2021/0241830 A1 * | 8/2021 | Lin | G11C 13/0026 |
| 2022/0068400 A1 * | 3/2022 | Pasotti | G11C 16/26 |
| 2022/0165333 A1 | 5/2022 | Ciocchini et al. | |
| 2022/0262446 A1 * | 8/2022 | Chang | G11C 17/18 |

FOREIGN PATENT DOCUMENTS

| | | | | |
|---|---|---|---|---|
| CN | 102290106 A | * | 12/2011 | |
| CN | 102640289 A | * | 8/2012 | ......... H01L 27/2409 |
| CN | 102884580 A | * | 1/2013 | ............. G11C 11/16 |
| CN | 103137861 A | * | 6/2013 | ......... G11C 13/0002 |
| CN | 106371347 A | * | 2/2017 | ........... G05B 19/042 |
| CN | 108257645 A | * | 7/2018 | ............. G11C 29/56 |
| CN | 108963071 A | * | 12/2018 | |
| CN | 110036444 A | * | 7/2019 | ............. G11C 11/56 |
| CN | 110036445 A | * | 7/2019 | ........ G11C 11/5685 |
| CN | 110164861 A | * | 8/2019 | ........... H01L 21/486 |
| CN | 106158030 B | * | 9/2019 | |
| CN | 110268530 A | * | 9/2019 | ........... G11C 11/161 |
| CN | 110299158 A | * | 10/2019 | ........ G11C 13/0004 |
| CN | 110431632 A | * | 11/2019 | ........ G11C 13/0021 |
| CN | 105336366 B | * | 12/2019 | ........ G11C 11/1659 |
| CN | 110546755 A | * | 12/2019 | ........ G11C 11/1659 |
| CN | 106205691 B | * | 1/2020 | ........... G11C 13/004 |
| CN | 106935703 B | * | 1/2020 | ......... H01L 27/2436 |
| CN | 110729012 A | * | 1/2020 | ........ G11C 13/0026 |
| CN | 106981301 B | * | 2/2020 | ........ G11C 11/5678 |
| CN | 110797062 A | * | 2/2020 | ........ G11C 13/0002 |
| CN | 110827913 A | * | 2/2020 | ............ G06F 11/076 |
| CN | 110910930 A | * | 3/2020 | ........... G11C 11/161 |
| CN | 111048134 A | * | 4/2020 | ........ G11C 11/5678 |
| CN | 111192614 A | * | 5/2020 | ............. G06F 7/5443 |
| CN | 111199768 A | * | 5/2020 | ........... G06F 11/1012 |
| CN | 111312304 A | * | 6/2020 | ............ G06F 11/102 |
| CN | 111312324 A | * | 6/2020 | ........... G06F 11/1008 |
| CN | 111338977 A | * | 6/2020 | ........... G06F 12/0246 |
| CN | 108604636 B | * | 4/2022 | ......... H01L 27/2436 |
| CN | 114765041 A | * | 7/2022 | ........ G11C 13/0004 |
| CN | 115516562 A | * | 12/2022 | ............ G11C 11/221 |
| CN | 117037869 A | * | 11/2023 | |
| DE | 102006033915 B3 | * | 12/2007 | ........ G11C 13/0011 |
| EP | 3852109 A1 | * | 7/2021 | ............ G06F 11/076 |
| WO | WO-9950853 A1 | * | 10/1999 | ........ G11C 11/5621 |

OTHER PUBLICATIONS

Dynamically Boosting Read Voltage for a Memory Device, U.S. Appl. No. 17/101,846, filed Nov. 23, 2020, Nicola Ciocchini et al., Patented Case, Nov. 23, 2021.

* cited by examiner

DYNAMICALLY BOOSTING READ VOLTAGE FOR A MEMORY DEVICE

RELATED APPLICATIONS

The present application is a continuation application of U.S. patent application Ser. No. 17/101,846, filed Nov. 23, 2020, issued as U.S. Pat. No. 11,373,705 on Jun. 28, 2022 the entire disclosure of which application is hereby incorporated herein by reference.

FIELD OF THE TECHNOLOGY

At least some embodiments disclosed herein relate to memory devices in general, and more particularly, but not limited to adjusting (e.g., boosting) a read voltage used to read memory cells of a memory device.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

A storage device is an example of a memory device. Typical computer storage devices have controllers that receive data access requests from host computers and perform programmed computing tasks to implement the requests in ways that may be specific to the media and structure configured in the storage devices. In one example, a memory controller manages data stored in memory and communicates with a computer device. In some examples, memory controllers are used in solid state drives for use in mobile devices or laptops, or media used in digital cameras.

Firmware can be used to operate a memory controller for a particular storage device. In one example, when a computer system or device reads data from or writes data to a memory device, it communicates with the memory controller.

Memory devices typically store data in memory cells. In some cases, memory cells exhibit non-uniform, variable electrical characteristics that may originate from various factors including statistical process variations, cycling events (e.g., read or write operations on the memory cells), or a drift (e.g., a change in resistance of a chalcogenide alloy), among others.

In one example, reading a set of data (e.g., a codeword, a page) is carried out by determining a read voltage (e.g., an estimated median of threshold voltages) of memory cells that store the set of data. In some cases, a memory device may include an array of PCM cells arranged in a 3D architecture, such as a cross-point architecture to store the set of data. PCM cells in a cross-point architecture may represent a first logic state (e.g., a logic 1, a SET state) associated with a first set of threshold voltages, or a second logic state (e.g., a logic 0, a RESET state) associated with a second set of threshold voltages. In some cases, data may be stored using encoding (e.g., error correction coding (ECC)) to recover data from errors in the data stored in the memory cells.

BRIEF DESCRIPTION OF THE DRAWINGS

The embodiments are illustrated by way of example and not limitation in the figures of the accompanying drawings in which like references indicate similar elements.

DETAILED DESCRIPTION

The following disclosure describes various embodiments for dynamically adjusting (e.g., boosting) a read voltage used to read memory cells of a memory device. At least some embodiments herein relate to memory devices that includes resistors in the memory array that are cycled over time and used to determine boost voltages for adjusting the read voltages. The memory device may, for example, store data used by a host device (e.g., a computing device of an autonomous vehicle, or another computing device that accesses data stored in the memory device). In one example, the memory device is a solid-state drive mounted in an electric vehicle.

In some cases, a memory device may include an array of PCM cells arranged in a 3D architecture, such as a cross-point architecture to store the set of data. PCM cells in a cross-point architecture may represent a first logic state (e.g., a logic 1, a SET state) associated with a first set of threshold voltages, or a second logic state (e.g., a logic 0, a RESET state) associated with a second set of threshold voltages.

In some memory devices using PCM cells, the SET and RESET threshold voltages decrease as a function of cumulated write operations. For example, write operations can cumulate up to several hundreds of thousands of writes. This can significantly degrade performance of the memory device, which may include failure of the memory device to properly read data. As a result, a system that uses data from the memory device may malfunction. For example, a vehicle using the data for control of the vehicle could crash causing physical damage or physical injury.

In many memory devices, the read voltage for reading memory cells of the memory device is set during manufacture (e.g., fused during probe trim-by-die testing). As threshold voltages decrease, read margin (e.g., E3 margin) is steadily reduced over time during normal operation of the memory device. This limits the write endurance capability of the memory device.

In some cases, memory cells exhibit different electrical characteristics after a number of cycling operations (e.g., a series of read or write operations). For example, a threshold voltage of a memory cell (e.g., PCM cell) corresponding to a logic state of 1, after receiving numerous programming pulses to store logic states of 1 (e.g., a SET programming pulse), may be different from a memory cell that is relatively new (e.g., a PCM cell with a small number of read or write operations). A memory cell having been cycled through an extensive number of read or write operations can have a significantly changed threshold voltage.

Shifts in threshold voltages for memory cells can be driven by electrode/interface resistance reduction in response to repeated electro-thermal stresses over time (e.g., due to write operations as described above). In some examples, the memory cells include chalcogenide (e.g., as used in PCM and/or other types of memory cells). In some memory devices, a periodic readout of raw bit error rate (e.g., E3 RBER) is checked to determine an extent of read margin (e.g., E3 margin). A memory controller or host device uses these checks to determine when to reduce read voltage. However, checking bit error rates can increase processing overhead (e.g., in some cases, bit error rates must be determined off-die by the host device).

To address these and other technical problems, a memory device adjusts a read voltage based on applying a current to one or more resistors in a memory array. The resistors act as a proxy for estimating threshold voltage shifts that occur in the memory cells as they are programmed over time by repeated programming cycles (e.g., thousands of write operations in normal operation). For example, the resistors can provide a proxy for the electrode/interface resistance changes discussed above. In one embodiment, the resistors are cycled over time. A current is applied to the resistors to determine a boost voltage for dynamically adjusting a read voltage to compensate for the threshold voltage shift that occurs over time.

In one embodiment, the resistor has a structure that is similar to a memory cell (e.g., PCM or other type of memory cell). For example, the resistor is only formed using electrode material, but without using a chalcogenide or other material that forms a logic storage element in the memory cell.

For example, in some cases, a chalcogenide material in the memory cells may experience a change (e.g., a drift) in its resistance after programming (e.g., crystallizing or quenching) of the chalcogenide material during a write operation. Such change in resistance may result in changes in threshold voltages of memory cells (e.g., PCM cells) after a certain period of time elapsed. In some embodiments, the amount of change may be a function of an ambient temperature.

In one embodiment, by forming the resistor without including the chalcogenide in the structure of the resistor, the above changes due to chalcogenide are not exhibited by the resistor. Thus, the resistor can better act as a proxy to use by a memory controller for adjusting read voltage to compensate for threshold voltage shifts due to the electrode/interface resistance changes discussed above.

In one embodiment, a memory device includes a memory array with memory cells read using a read voltage. The memory cells are programmed over time by various write operations. A counter is used to count the write operations performed for the memory cells. The memory device includes one or more resistors as discussed above.

A memory controller of the memory device is configured to increment the counter as the write operations are performed. The controller determines that the counter has reached a limit (e.g., 1,000 write operations have occurred for a region of the memory array). In response to determining that the counter has reached the limit, the controller performs a write operation for each of the resistors. The write operation for each resistor corresponds to at least one of the write operations for the memory cells (e.g., similar voltages are applied to word and bit lines used to access and bias each resistor). In one example, applying the write operations to the resistors provides a proxy (e.g., an estimate or simulation) for the average wear experienced by memory cells. The limit used for the counter is set to target this average wear. The limit can be set based on programming patterns, expected usage, etc. In one example, different limits can be used for applying write operations to different resistors (e.g., depending on location in a memory array, and/or corresponding memory cell type for which a boost voltage is determined).

In one example, the programming frequency (e.g., the counter limit above) for the resistor is a fixed number based on an average write interpulse delay (IPD). In one example, the programming frequency is adaptive based on a context of operation of the memory device.

In one example, the programming frequency is based on a wear-level monitor. For example, if media management increases a number of cycles added to a memory array, a corresponding increase (or other change) in cycles will be added to the programming frequency.

When a read operation is to be performed, the controller determines, by applying a current to one or more resistors, a boost voltage. Based on the boost voltage, the controller adjusts a read voltage for reading the memory cells of the memory array. The controller then reads the memory cells (e.g., cells corresponding to a page of data being read) using the adjusted read voltage.

In one embodiment, several resistors are formed in a memory array by depositing electrode material similar to the electrode material used in the memory cells of the memory array. The resistors are periodically programmed using similar voltages as applied to the memory cells during normal operation. In one example, the resistors are programmed at periodic intervals based on a number of write operations performed on the memory array.

In one embodiment, a memory controller determines a boost voltage to use in adjusting a read voltage at the time of receiving a read command from a host device. The boost voltage is determined by applying a current to the resistors. In one example, a voltage difference across each resistor is provided as an input to a differential buffer. An output from the differential buffer provides the boost voltage. The read voltage is then adjusted based on the boost voltage. In one example, the read voltage is adjusted by reducing the voltage applied to a word line by the amount of the boost voltage. This permits the dynamic reduction of word line voltage in response to changes in the stack resistance/threshold voltage for memory cells that occur due to cycling over time, such as discussed above.

Advantages provided by various embodiments for adjusting read voltage as described herein include the following: The need to allocate extra read margin (e.g., E3 margin) at the time of manufacture to guard-band for early cycling evolution can be eliminated. Variations from one die to another die are accounted for by the on-chip circuit used to adjust the read voltage. For example, process variations and conversions in line/via/electrode resistances is accounted for by the on-chip circuit. Performance of read voltage adjustment can increase performance by reducing or eliminating the communication with a host device to periodically check for raw bit error rates, such as discussed above.

Figure 1:
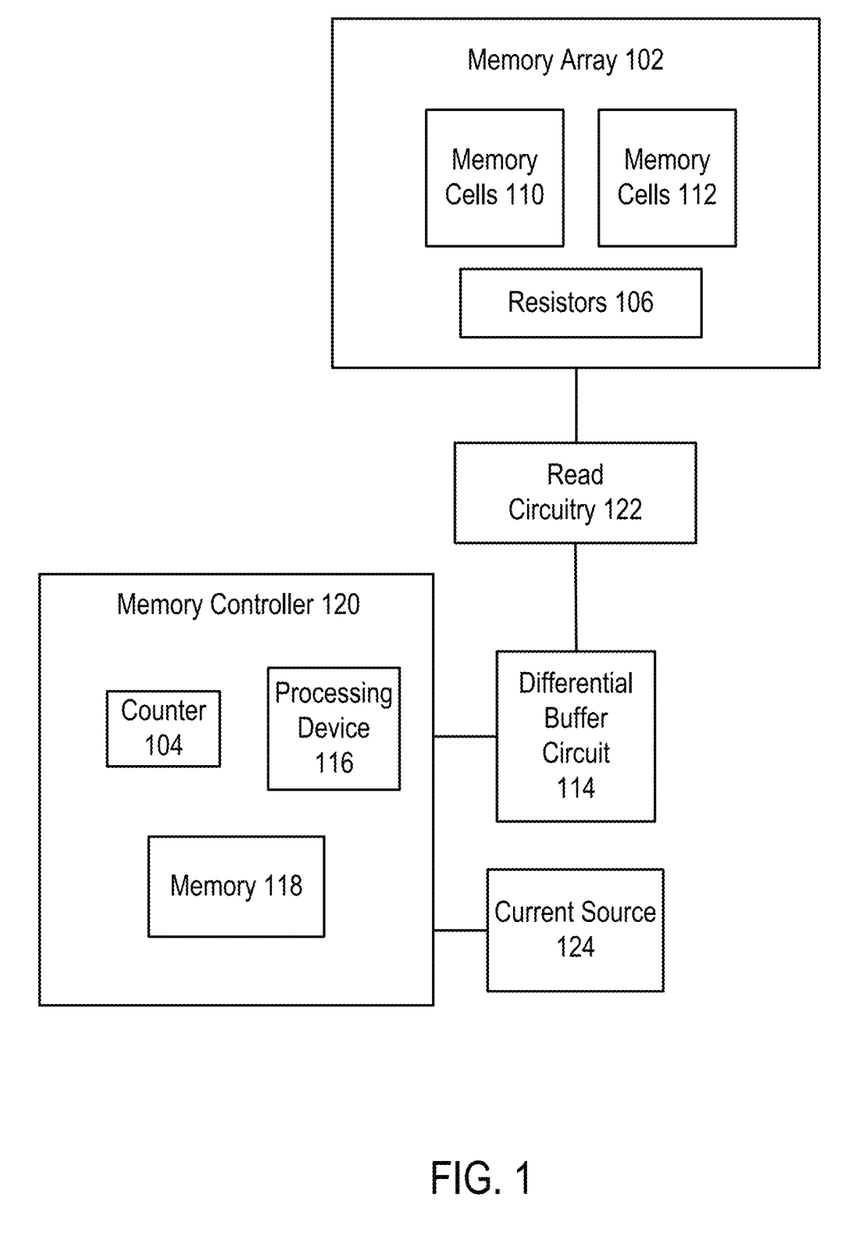
FIG. 1 shows a memory device that applies a current to resistors of a memory array to dynamically adjust read voltages for reading data in memory cells of the memory array, in accordance with some embodiments.

FIG. 1 shows a memory device that applies a current to resistors 106 of a memory array 102 to dynamically adjust read voltages for reading data in memory cells 110, 112 of the memory array, in accordance with some embodiments. In one embodiment, each resistor 106 has a structure similar to or the same as each memory cell, except that the resistor does not include the material used to form a logic storage element of the memory cell.

In one example, each resistor 106 is similar to a PCM cell and includes electrode material (e.g., carbon), but excludes any chalcogenide material. In one embodiment, this is accomplished by using common processing steps and materials to form the resistors as is used to form the memory cells. In one example, this provides electrode-only cells that act as resistors 106. In one example, the memory cells use chalcogenide, but are formed as a type of memory other than PCM.

In one embodiment, resistors 106 are formed as an integral part of memory array 102. In other embodiments, resistors 106 can be formed separate from memory array 102.

In one embodiment, memory cells 110 and 112 are different types of memory cells. In this case, respective resistors 106 can be formed to correspond to each different type of memory cell. The adjusted read voltage can be different for each type of memory cell.

Memory controller 120 controls access to memory array 102. This access includes performing read and write operations for memory cells 110, 112. Memory controller 120 uses read circuitry 122 to perform read operations on memory cells 110, 112. Memory controller 120 includes processing device 116 and memory 118. Memory 118 may contain firmware executed by processing device 116 to implement dynamic adjustment of read voltages, as described herein. Processing device 116 increments counter 104 as write operations are performed on memory array 102 (e.g., operations on selected portions of the array).

Memory controller 120 controls the operation of differential buffer circuit 114 and current source 124. When reading memory cells, current source 124 is used to apply a current to each of resistors 106. This provides a voltage across each resistor 106 that is provided as an input to differential buffer circuit 114. An output from differential buffer circuit 114 is a boost voltage that is used to adjust a read voltage implemented by read circuitry 122 to read the memory cells. In one example, memory controller 120, differential buffer circuit 114, current source 124, read circuitry 122, and memory 102 are implemented on the same chip or die.

Figure 2:
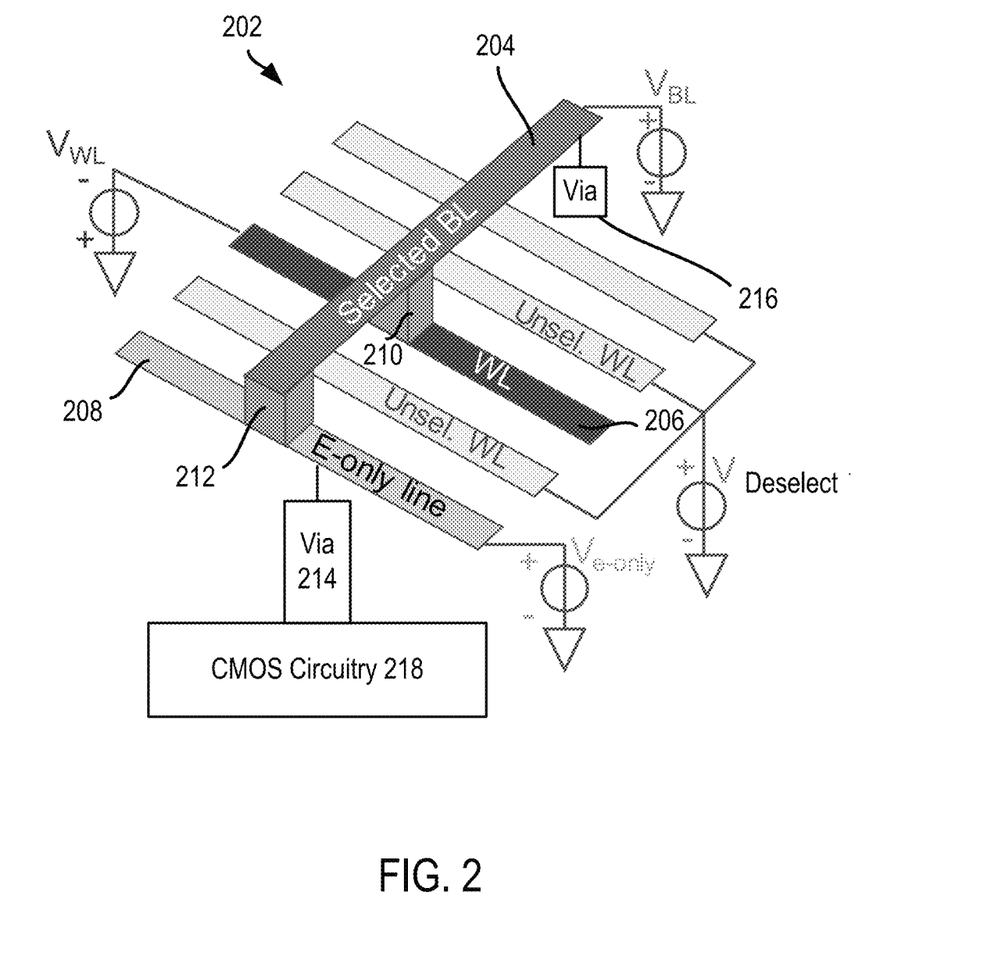
FIG. 2 shows a cross-point architecture for a memory array including a resistor used to adjust read voltages for reading memory cells of the memory array, in accordance with some embodiments.

FIG. 2 shows a cross-point architecture for a memory array 202 including a resistor 212 used to adjust read voltages for reading memory cells 210 of the memory array, in accordance with some embodiments. Resistor 212 is an example of resister 106. Memory cell 210 is an example of memory cell 110, 112.

Memory cell 210 is selected for reading or writing using bit line 204 and word line 206. Other memory cells (not shown) are selected using other of the word lines as shown.

Conductive line 208 is used in conjunction with bit line 204 to access resistor 212 for applying a current, such as discussed above. In one example, conductive line 208 is a word line patterned using common processing steps as used to form word line 206 and the other word lines as shown. In one example, each word line is patterned from a tungsten layer during manufacture. When a current is being applied to resistor 212, word line 206 and the other word lines are deselected.

In one embodiment, word line 206, the other word lines shown, and line 208 are each connected by vias to CMOS or other transistor circuitry 218 that is located under memory array 202. For example, line 208 is electrically connected to CMOS circuitry 218 by via 214. For example, bit line 204 is electrically connected to CMOS circuitry 218 by via 216. Each word line is also connected to CMOS circuitry 218 by vias (not shown).

CMOS circuitry 218 is used to apply bias voltages to memory array 202. For example, a positive voltage is applied to conductive line 204. For example, a negative voltage is applied to word line 206 to program memory cell 210. For example, a positive or zero voltage is applied to unselected word lines when reading memory cell 210. In one example, CMOS circuitry 218 includes differential buffer circuit 114, current source 124, read circuitry 122, and/or processing device 116.

Figure 3:
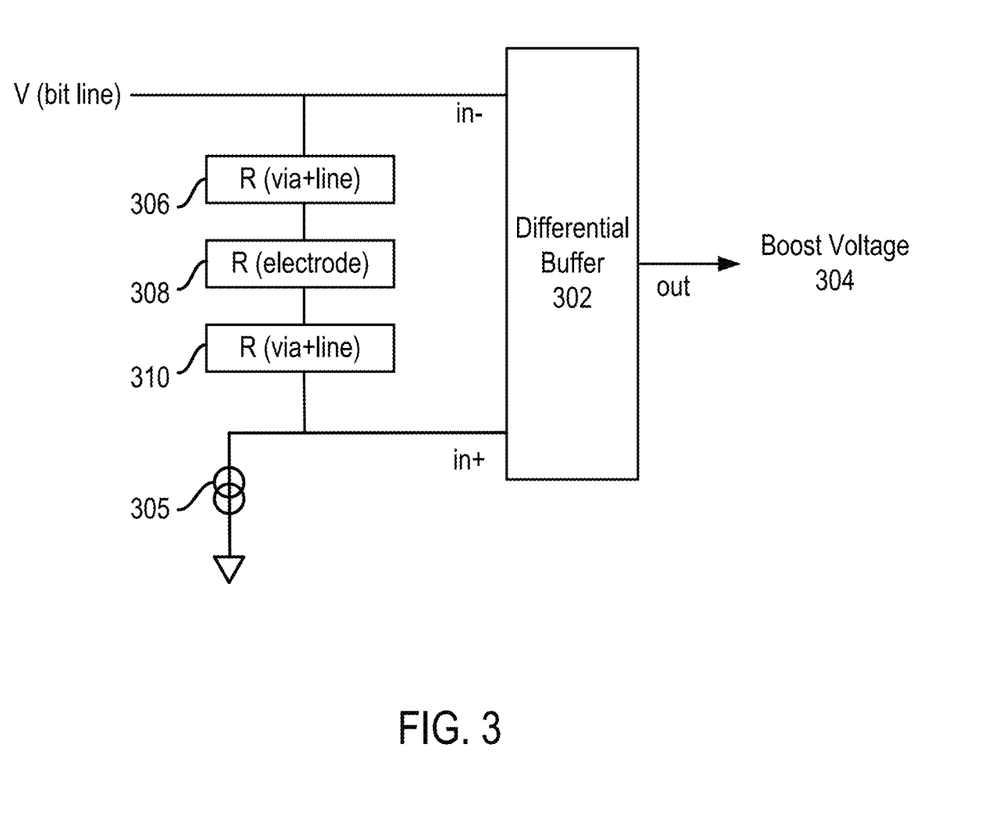
FIG. 3 shows a circuit for dynamically determining a boost voltage used in adjusting a read voltage for reading memory cells of a memory array, in accordance with some embodiments.

FIG. 3 shows a circuit for dynamically determining a boost voltage 304 used in adjusting a read voltage for reading memory cells of a memory array, in accordance with some embodiments. The circuit is an example of differential buffer circuit 114.

The circuit includes differential buffer 302 (e.g., a high impedance buffer circuit) having inputs of a bit line voltage across resistances 306, 308, 310 caused by applying a current using current source 305. Current source 305 is an example of current source 124. Resistance 308 is an example of resistor 212. Resistance 306 is an example of resistance provided by bit line 204 and via 216. Resistance 310 is an example of resistance provided by line 208 and via 214.

In one example, as illustrated, boost voltage 304 is inversely proportional to the sum of resistances 306, 308, 310. In other examples, boost voltage 304 may be proportional to the resistances, such as for different types of memory cells. The circuit can be configured for the desired polarity. In one example, boost voltage 304 is less than 500 millivolts (e.g., 50-200 millivolts).

In one example, the total of resistances 306, 308, 310 is between 10K-100K ohm. In one example, the current source applies a current of less than 10 microamps (e.g., 1-4 microamps).

In one embodiment, boost voltage 304 is an output from differential buffer 302 that is proportional to the total of resistances 306, 308, 310. The gain of differential buffer 302 is adjusted by design or otherwise configured (e.g., in real-time by memory controller 120) to provide an appropriate range of boost voltage 304. Boost voltage 304 is used to adjust a read voltage applied to read memory cells of a memory array. In one embodiment, interpulse delay (IPD) is taken into account in adjusting gain and/or calibrating the boost circuit.

In other embodiments, other types of amplifiers can be used. In one example, a high-impedance amplifier is used. In one example, a single-ended amplifier is used. In one example, a differential operational amplifier is used.

Figure 4:
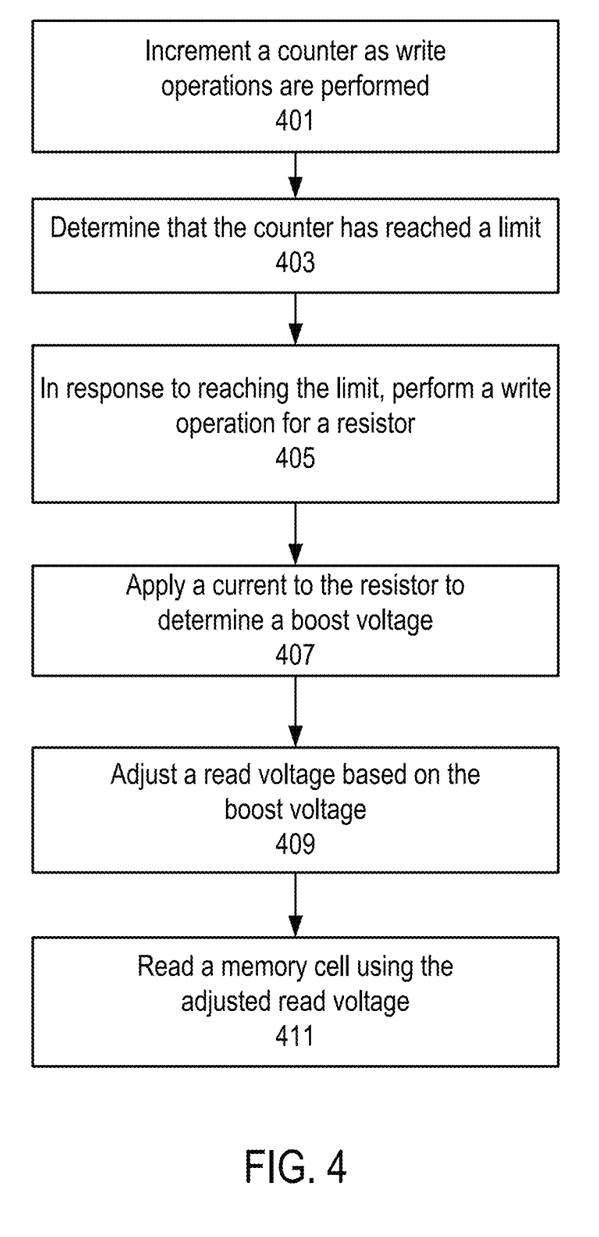
FIG. 4 shows a method for dynamically determining a boost voltage to adjust a read voltage, in accordance with some embodiments.

FIG. 4 shows a method for dynamically determining a boost voltage to adjust a read voltage, in accordance with some embodiments. For example, the method of FIG. 4 can be implemented in the system of FIG. 1. In one example, memory controller 120 uses differential buffer circuit 114 adjust to adjust a read voltage provided by read circuitry 122.

The method of FIG. 4 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 4 is performed at least in part by one or more processing devices (e.g., processing device 116 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 401, a counter is incremented as write operations are performed on memory cells in a memory array. In one example, the counter is incremented based on a number of write operations to memory array 102.

At block 403, it is determined that the counter has reached a limit. In one example, processing device 116 determines that counter 104 has reached a fixed number of write operations. In one example, the limit is adaptive and is varied by processing device 116 depending on history and/or a context of operation of a memory device.

At block 405, in response to reaching the limit, a write operation is performed for one or more resistors in the memory array. In one example, a write operation is performed for resistor 212.

At block 407, a current is applied to each resistor to determine a boost voltage. In one example, differential buffer circuit 114 is used to provide a boost voltage 304. At block 409, a read voltage is adjusted based on the boost voltage. In one example, read circuitry 122 adjusts a read voltage based on a boost voltage provided by differential buffer circuit 114. At block 411, one or more memory cells are read using the adjusted read voltage. In one example, memory cell 210 is read using a read voltage as adjusted based on a boost voltage determined from applying a current to resistor 212.

In one embodiment, blocks 407, 409, and 411 are performed during a read operation. In one embodiment, the read operation is performed in response to a read command from a host device or from a media management process (e.g., a process executing on-chip or off-chip from the memory array). In one example, the functions of blocks 407, 409, and 411 are executed simultaneously by a memory controller, and performance of the functions is read completion time-neutral.

In one embodiment, a system includes: a memory array (e.g., 102, 202) including memory cells read using a read voltage; a counter (e.g., 104) configured to count write operations performed for the memory cells; a resistor (e.g., 106, 212); and a memory controller (e.g., 120). The memory controller is configured to: increment the counter as the write operations are performed; determine that the counter has reached a limit; in response to determining that the counter has reached the limit, perform a write operation for the resistor, where the write operation for the resistor corresponds to at least one of the write operations for the memory cells; determine, by applying a current to the resistor, a first voltage; adjust, based on the first voltage, a read voltage for reading a first memory cell of the memory array; and read the first memory cell using the adjusted read voltage.

In one embodiment, the system further includes a conductive line (e.g., bit line 204) used to read at least a portion of the memory cells, where the conductive line is used to apply the current to the resistor.

In one embodiment, the write operation for the resistor includes applying at least one bias voltage to the resistor corresponding to at least one bias voltage applied for programming one of the memory cells; and the first voltage is proportional to a shift in threshold voltage for the memory cells that occurs as the write operations are performed.

In one embodiment, the system further includes a differential buffer circuit (e.g., 114) to provide the adjusted read voltage, where the first voltage is an input to the differential buffer circuit.

Figure 6:
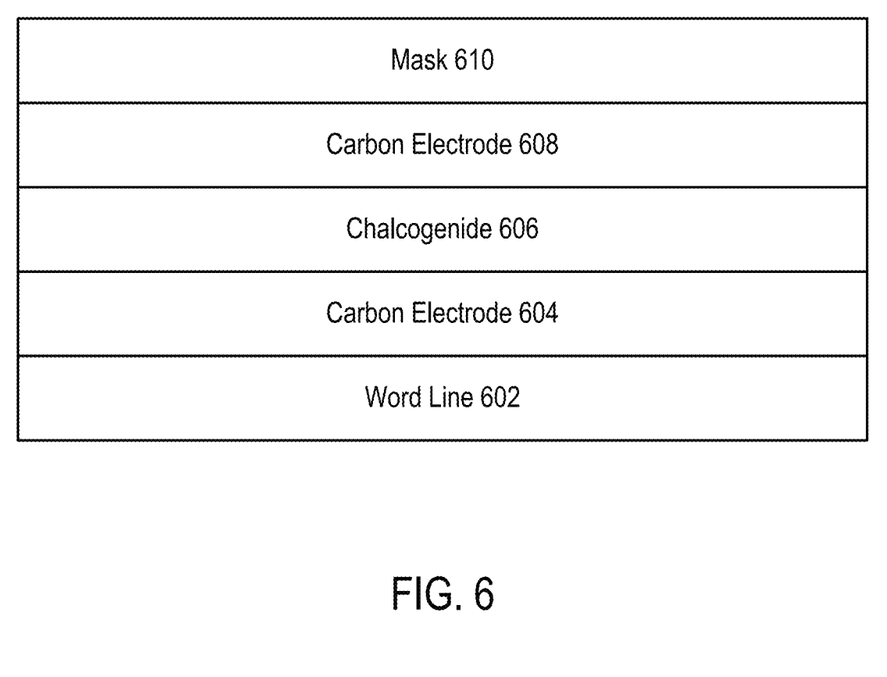
FIGS. 6-9 show steps for fabricating resistors in a memory array that includes memory cells, in accordance with some embodiments.

In one embodiment, each memory cell (e.g., structure 902 of FIG. 9) includes a chalcogenide (e.g., 606), a top carbon electrode (e.g., 608) above the chalcogenide, and a bottom carbon electrode (e.g., 604) below the chalcogenide.

In one embodiment, the resistor includes carbon, and excludes the chalcogenide.

In one embodiment, the system further includes word lines (e.g., 206) to access the memory cells. The resistor is located at an edge of the memory array, and the current is applied to the resistor using at least one of the word lines.

In one embodiment, the resistor is formed of a material used to form electrodes of the memory cells, and the resistor excludes a data storage device (e.g., logic storage element such as chalcogenide).

In one embodiment, a device includes: a memory array including memory cells, where each memory cell includes a chalcogenide, a top carbon electrode above the chalcogenide, and a bottom carbon electrode below the chalcogenide; conductive lines underlying the memory cells, the conducting lines including word lines (e.g., 206) to select the memory cells for reading; and a resistor configured so that a current applied to the resistor using one of the conductive lines determines a read voltage for reading at least one of the memory cells.

In one embodiment, the resistor includes carbon, but excludes the chalcogenide.

In one embodiment, the conductive lines are patterned using a common mask.

In one embodiment, the resistor includes a same material as at least one of the top carbon electrode or the bottom carbon electrode.

In one embodiment, the device further includes bit lines (e.g., 204) overlying the memory cells, where a first bit line of the bit lines is configured to select at least a portion of the memory cells, and to select the resistor for applying the current.

Figure 5:
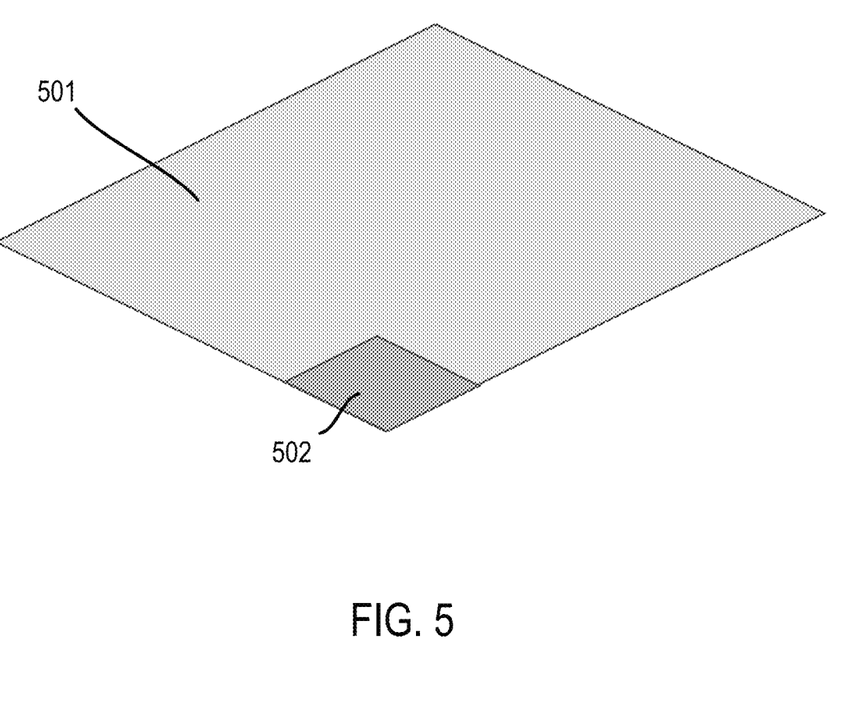
FIG. 5 shows a perspective view of a top area plan for a memory array that includes a region for resistors, in accordance with some embodiments.

FIG. 5 shows a perspective view of a top area plan for a memory array that includes a region 502 for resistors, in accordance with some embodiments. In one embodiment, area 501 generally corresponds to a two-dimensional boundary of a memory array in which memory cells are formed. Area 501 is defined from the perspective of a top view looking downward towards the memory array (not shown), which overlies a semiconductor substrate (not shown). In one example, the memory array is memory array 102 or 202.

In one embodiment, one or more resistors are formed in region 502, which is located at an edge of the memory array (e.g., in a corner of the memory array as illustrated). In one example, the resistors are resistors 106 or 212.

In other embodiments, region 502 can be located in one or more interior areas of the memory array. In one example, resistors are formed in areas near a memory cell type that corresponds to the resistor structure.

In one embodiment, area 501 indicates the boundaries of a chop-like mask. Region 502 indicates the boundaries of a portion of the memory array in which memory cells are removed using the mask. Resistors are formed in region 502, with each resistor having an electrode-only structure, which excludes materials used to form the logic storage element of the memory cells. In one example, region 502 indicates an electrode-only island in which resistors 106 are formed. In one example, the resistors are formed of carbon electrode material, but exclude a chalcogenide material used to form the memory cells of the memory array.

In one embodiment for fabricating the resistors, a hard mask is formed having the boundaries of area 501. The mask is formed overlying top electrodes of memory cells in a memory array. The mask is patterned to define region 502. An etch is performed to provide openings (e.g., 702 in FIG. 7) in which resistors are formed in region 502. The etch to provide the openings removes a portion of previously-formed memory cells to expose a portion of word lines (not shown) underlying the memory cells of the memory array. In one example, after providing the openings, a carbon layer is deposited overlying the memory cells and to fill the openings. The carbon layer is etched to expose the top electrodes of the memory array and to provide the final structure of the resistors. The carbon used to form the carbon layer is the same material used to form the top electrodes of the memory cells.

FIGS. 6-9 show steps for fabricating resistors in a memory array that includes memory cells, in accordance with some embodiments. In one example, the memory array is memory array 202, the memory cells are memory cell 210, and the resistors are resistor 212.

FIG. 6 shows a word line layer 602 formed overlying a semiconductor substrate (not shown). The semiconductor substrate can be, for example, silicon, germanium, gallium arsenide, or gallium nitride. In some examples, the substrate is a semiconductor wafer. In some examples, the substrate is a silicon-on-insulator (SOI) substrate.

Word line layer 602 is patterned to provide word lines for the memory array. In one example, the word lines include word line 206, the other word lines of FIG. 2, and also line 208. In one example, word line layer 602 is tungsten. In other examples, other conductive materials can be used such as copper, gold, titanium, metal alloys, or conductively-doped semiconductors.

A stack of materials used to form each memory cell is provided by top carbon electrode layer 608, chalcogenide layer 606, and bottom carbon electrode layer 604. These materials are patterned to provide the memory cells of the memory array. In the illustrated example, chalcogenide is used to provide a logic storage element for each memory cell. In other examples, the logic storage element can be provided by different materials. In one example, layer 606 can be formed of a polymer-based material or a metal oxide.

After the above materials or pattern to provide the memory cells, a mask layer 610 is formed. In one example, mask layer 610 is a hard mask having boundaries corresponding to area 501.

Figure 7:
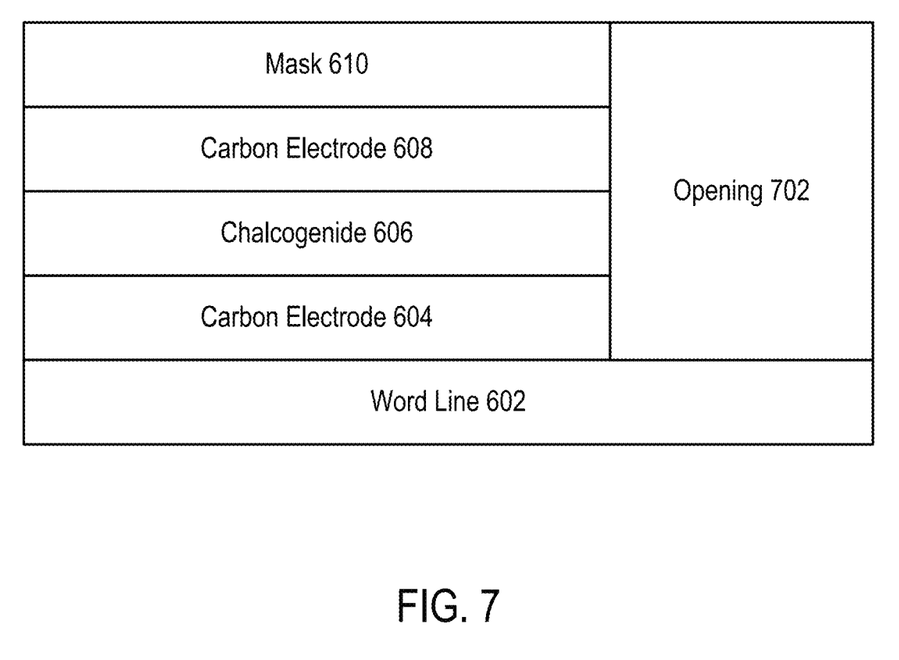

FIG. 7 shows that mask layer 610 is patterned to provide openings 702 in which resistors will be formed. In one example, openings 702 are formed in, and correspond to, region 502. Providing openings 702 exposes a top portion of word lines 602.

Figure 8:
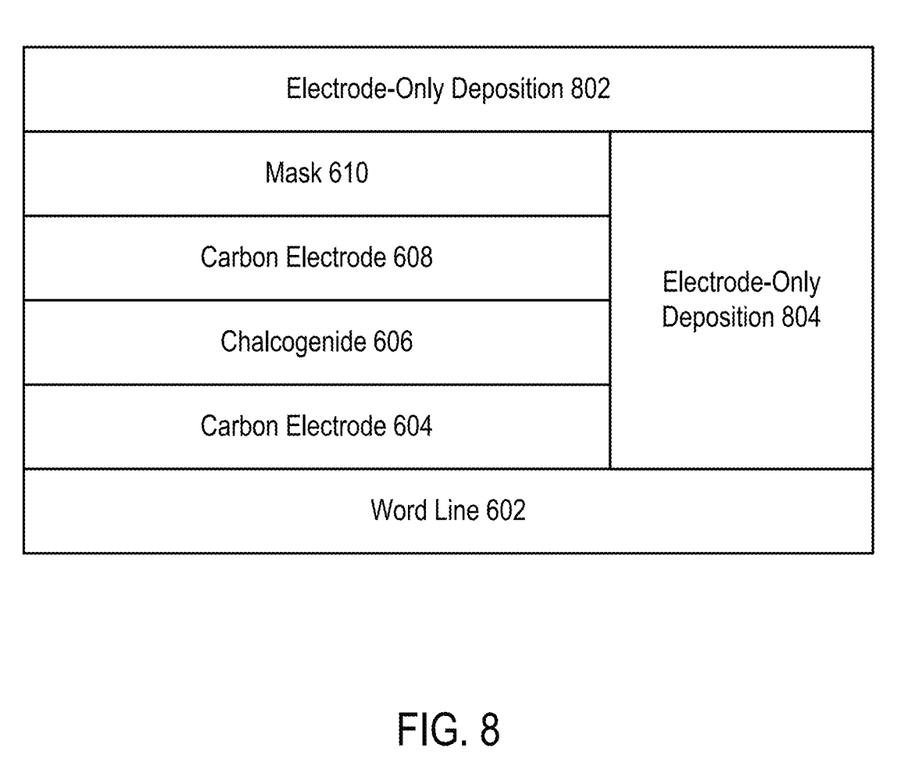

FIG. 8 shows an electrode-only deposition that is performed using mask layer 610. A portion 804 of the electrode-only deposition fills the openings 702. Another portion 802 of the electrode-only deposition is formed overlying mask layer 610. In one example, the electrode-only deposition is carbon. In one example, the electrode-only deposition is performed using the same materials and/or processing as used to form carbon electrode layers 604, 608.

Figure 9:
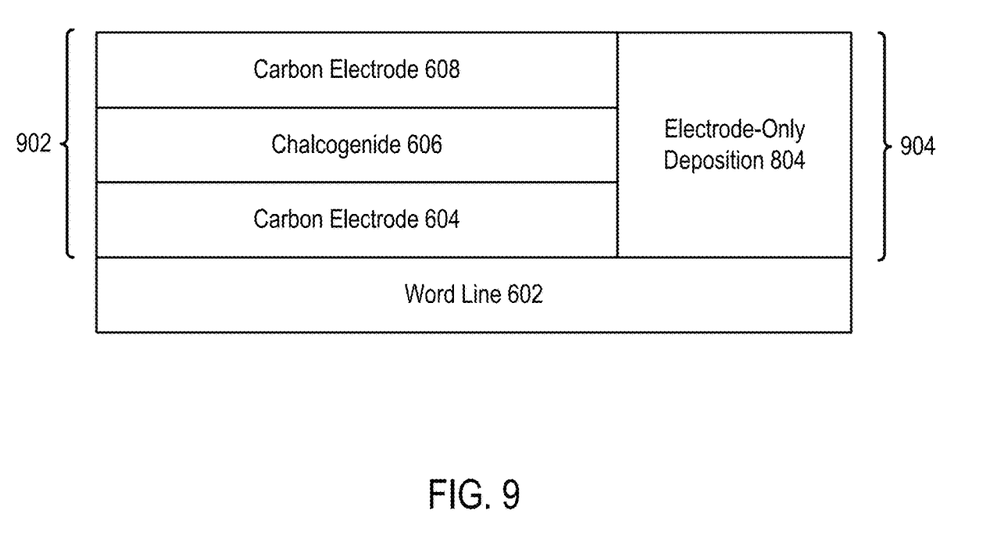

FIG. 9 shows that an etch has been performed to remove portion 802 of the electrode-only deposition, and also to remove mask layer 610. Portion 804 of the electrode-only deposition has been partially etched to provide the structure 904 for the resistors. In one example, structure 904 is provided using an etch-back process in conjunction with chemical mechanical polishing. The chemical mechanical polishing also opens up the top electrode of the memory cells.

The structure 902 of the memory cells is also provided by the processing above. In one example, the chemistry used to perform the etching to provide the resistors is the same chemistry used to etch carbon electrode layer 604, 608 and/or chalcogenide layer 606 for the memory cells. Conventional deposition, patterning, and/or etching processes can be used in the fabrication above.

In one embodiment, after performing the above process steps, the word lines formed from word line layer 602 are connected to CMOS circuitry under the memory array using conventional vias. In one example, the CMOS circuitry is CMOS circuitry 218.

Figure 10:
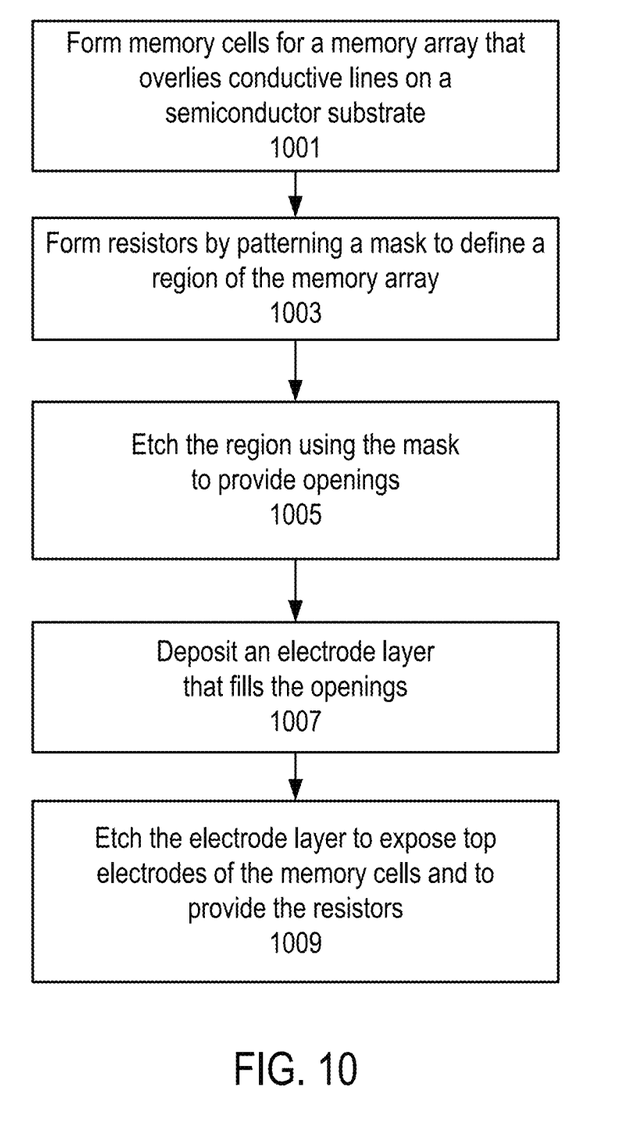
FIG. 10 shows a method for fabricating memory cells and resistors in a memory array, in accordance with some embodiments.

FIG. 10 shows a method for fabricating memory cells and resistors in a memory array, in accordance with some embodiments. For example, the method of FIG. 10 can be implemented as illustrated in FIGS. 6-9. In one example, the memory cells are memory cells 110, 112, 210. In one example, the resistors are resistors 106, 212.

Although shown in a particular sequence or order, unless otherwise specified, the order of the processes can be modified. Thus, the illustrated embodiments should be understood only as examples, and the illustrated processes can be performed in a different order. Additionally, one or more processes can be omitted in various embodiments. Thus, not all processes are required in every embodiment. Other process flows are possible.

At block 1001, memory cells are formed for a memory array that overlies conductive lines on a semiconductor substrate. In one example, the memory cells are memory cells 210, and the conductive lines include word line 206, and line 208.

At block 1003, resistors are formed by patterning a mask to define a region of the memory array. In one example, the resistors include resistor 212. In one example, the mask is mask layer 610.

At block 1005, the region is etched using the mask to provide openings. In one example, the openings are openings 702.

At block 1007, an electrode layer is deposited that fills the openings. In one example, the electrode layer is portions 802, 804 of an electrode-only deposition.

At block 1009, the electrode layer is etched to expose top electrodes of the memory cells and to provide the resistors. In one example, the top electrodes are provided by carbon electrode layer 608. In one example, the memory cells have structure 902, and the provided resistors have structure 904.

In one embodiment, a method includes: forming conductive lines (e.g., word lines formed from word line layer 602) overlying a semiconductor substrate; forming memory cells (e.g. memory cells 210, structure 902) of a memory array overlying the conductive lines, where each memory cell includes a chalcogenide, a top electrode (e.g., electrodes formed using carbon electrode layer 608) above the chalcogenide, and a bottom electrode below the chalcogenide (e.g., electrodes formed using carbon electrode layer 604), and where a first portion of the conductive lines is configured to select the memory cells for writing and reading; and forming resistors (e.g., structure 904) overlying a second portion of the conductive lines, where each resistor includes a material (e.g., portion 804 of electrode-only deposition) used to form at least one of the top electrode or the bottom electrode, and the second portion of the conductive lines is configured to select each resistor for applying a current to the resistor.

In one embodiment, the conductive lines are word lines. The method further includes forming bit lines (e.g., bit lines 204) overlying the memory cells, where the word lines and the bit lines are configured in a cross-point architecture and used to select individual ones of the memory cells.

In one embodiment, the material is carbon.

In one embodiment, the memory cells are part of a memory array, and forming the resistors includes: forming a mask (e.g., mask layer 610) overlying the top electrodes of the memory cells; patterning the mask to define a region (e.g., region 502) of the memory array for forming the resistors; performing an etch to provide openings (e.g., openings 702) for the resistors in the region; removing the mask; depositing a carbon layer overlying the memory cells and filling the openings; and etching the carbon layer to expose the top electrodes and provide the resistors (e.g., structure 904).

In one embodiment, performing the etch to provide the openings includes removing a portion of the formed memory cells to expose a portion of the conductive lines.

In one embodiment, the method further includes: forming transistor circuitry (e.g., CMOS circuitry 218) underlying the memory cells, the transistor circuitry configured to apply the current to each resistor, and to adjust a read voltage for reading the memory cells based on a boost voltage (e.g., boost voltage 304) determined from applying the current to the resistors; and forming vias (e.g., vias 214, 216) to connect the conductive lines to the transistor circuitry.

In one embodiment, the conductive lines are word lines, and each word line includes tungsten.

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement some of the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A device comprising:
a memory array having memory cells;
a resistor; and
a controller configured to:
   determine a characteristic of the resistor;
   select, based on the characteristic, a read voltage;
   read one or more of the memory cells using the read voltage; and
   a counter configured to count write operations performed for at least a portion of the memory cells, wherein the write operation for the resistor is performed in response to determining that the counter has reached a limit.

2. The device of claim 1, wherein the controller is further configured to perform a write operation for the resistor, wherein performing the write operation for the resistor comprises applying at least one bias voltage to the resistor corresponding to at least one bias voltage applied for programming the memory cells.

3. The device of claim 1, wherein the resistor is formed of a material used to form electrodes of the memory cells.

4. The device of claim 2, wherein the write operation for the resistor corresponds to a write operation for the memory cells.

5. The device of claim 2, wherein performing the write operation for the resistor comprises applying a current to the resistor, and the characteristic is a voltage.

6. The device of claim 1, wherein selecting the read voltage comprises adjusting a read voltage for reading a first memory cell of the memory array.

7. The device of claim 1, wherein each memory cell comprises a chalcogenide.

8. The device of claim 1, further comprising a differential buffer circuit configured to provide the selected read voltage, wherein the characteristic is an input to the differential buffer circuit.

9. A device comprising:
a memory array including memory cells;
a resistor; and
a controller configured to:
 select, based on applying a current to the resistor, a read voltage;
 read at least one of the memory cells using the read voltage;
 count a number of write operations for the memory cells; and
 determine whether the number of write operations has reached a limit, wherein the current is applied to the resistor in response to determining that the number has reached the limit.

10. The device of claim 9, wherein each memory cell comprises a chalcogenide.

11. The device of claim 10, wherein each memory cell further comprises a top electrode above the chalcogenide, and a bottom electrode below the chalcogenide.

12. The device of claim 11, wherein the resistor comprises a same material used to form at least one of the top or bottom electrode.

13. The device of claim 9, wherein the resistor is formed of a material used to form electrodes of the memory cells.

14. The device of claim 9, wherein the resistor comprises carbon.

15. The device of claim 9, further comprising a conductive line used to read at least a portion of the memory cells, wherein the conductive line is used to apply the current to the resistor.

16. The device of claim 9, wherein the resistor is located at an edge of the memory array.

17. The device of claim 9, further comprising word lines and bit lines configured in a cross-point architecture, wherein the word lines and bit lines are further configured to select individual ones of the memory cells, and to select the resistor.

18. A method comprising:
performing a write operation for a resistor configured in a memory array;
determining a characteristic of the resistor;
selecting, based on the characteristic, a read voltage;
reading, using the read voltage, one or more memory cells of the memory array;
counting a number of write operations for the memory cells; and
determining whether the number of write operations has reached a limit, wherein the write operation for the resistor is performed in response to determining that the counter has reached a limit.

* * * * *